United States Patent
Heo et al.

(10) Patent No.: US 12,072,389 B2
(45) Date of Patent: Aug. 27, 2024

(54) BIG DATA-BASED BATTERY INSPECTION METHOD

(71) Applicant: LG ENERGY SOLUTION, LTD., Seoul (KR)

(72) Inventors: Yeonhyuk Heo, Daejeon (KR); Ji Won Park, Daejeon (KR); Gangchea Lee, Daejeon (KR); Myunghan Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 127 days.

(21) Appl. No.: 17/789,983

(22) PCT Filed: Jan. 7, 2021

(86) PCT No.: PCT/KR2021/000165
§ 371 (c)(1),
(2) Date: Jun. 29, 2022

(87) PCT Pub. No.: WO2021/172735
PCT Pub. Date: Sep. 2, 2021

(65) Prior Publication Data
US 2022/0381840 A1    Dec. 1, 2022

(30) Foreign Application Priority Data
Feb. 25, 2020  (KR) .................. 10-2020-0022634

(51) Int. Cl.
*G01R 31/389*  (2019.01)
*H01M 10/48*   (2006.01)
*H01M 50/534*  (2021.01)

(52) U.S. Cl.
CPC .......... *G01R 31/389* (2019.01); *H01M 10/48* (2013.01); *H01M 50/534* (2021.01)

(58) Field of Classification Search
None
See application file for complete search history.

(56) References Cited

U.S. PATENT DOCUMENTS

| 5,453,689 A  * | 9/1995 | Goldfine ............... G01N 27/72 324/207.17 |
| 6,285,185 B1 | 9/2001 | Asjes |

(Continued)

FOREIGN PATENT DOCUMENTS

| DE | 4201502 C2 | 12/1995 |
| JP | S59-104545 A | 6/1984 |

(Continued)

OTHER PUBLICATIONS

Office Action issued Jul. 18, 2023 for counterpart European Patent Application No. 21760133.5.

(Continued)

*Primary Examiner* — Jas A Sanghera
(74) *Attorney, Agent, or Firm* — MORGAN, LEWIS & BOCKIUS LLP

(57) ABSTRACT

The present invention relates to a big data-based battery inspection method. Specifically, the present invention is for providing a big data-based battery inspection method which applies information on a metal part of a battery measured by an eddy current sensor to a discrimination function so as to quickly inspect the state of the metal part.

9 Claims, 5 Drawing Sheets

(56) References Cited

U.S. PATENT DOCUMENTS

| | | |
|---|---|---|
| 2003/0041445 A1 | 3/2003 | Jang et al. |
| 2006/0109003 A1 | 5/2006 | Redko et al. |
| 2012/0126803 A1* | 5/2012 | Goldfine ............... G01N 27/90 |
| | | 324/239 |
| 2019/0170703 A1 | 6/2019 | Koo et al. |
| 2020/0185697 A1 | 6/2020 | Kim et al. |
| 2021/0181150 A1* | 6/2021 | Böhm ............... G01N 27/9006 |
| 2022/0034843 A1 | 2/2022 | Kim et al. |

FOREIGN PATENT DOCUMENTS

| | | |
|---|---|---|
| JP | H06-215802 A | 8/1994 |
| JP | 3309702 B2 | 7/2002 |
| JP | 2007-225564 A | 9/2007 |
| KR | 10-0388314 B1 | 6/2003 |
| KR | 10-2006-0134764 A | 12/2006 |
| KR | 10-2008-0070292 A | 7/2008 |
| KR | 10-2011-0098535 A | 9/2011 |
| KR | 10-2013-0019872 A | 2/2013 |
| KR | 10-1339117 B1 | 12/2013 |
| KR | 10-2017-0141400 A | 12/2017 |
| KR | 10-2018-0092445 A | 8/2018 |
| KR | 10-2019-0053014 A | 5/2019 |
| KR | 10-2023739 B1 | 9/2019 |
| KR | 10-2020-0005290 A | 1/2020 |
| WO | 2020/009337 A1 | 1/2020 |

OTHER PUBLICATIONS

Mukhopadhyay, "41.2: Neural Network Aided Estimation of Near-Surface Material Properties using Planar Type Micromagnetic Sensors", 2002, IEEE, Proceedings of IEEE Sensors 2002, vol. 2, p. 747-752.

International Search Report (with partial translation) and Written Opinion dated Apr. 27, 2021, for corresponding International Patent Application No. PCT/KR2021/000165.

Office Action issued Jun. 19, 2023 for counterpart Japanese Patent Application No. 2022-535675 .

Office Action dated Mar. 15, 2024 issued in corresponding Korean Application No. 10-2020-0022634.

* cited by examiner

[Fig. 1]
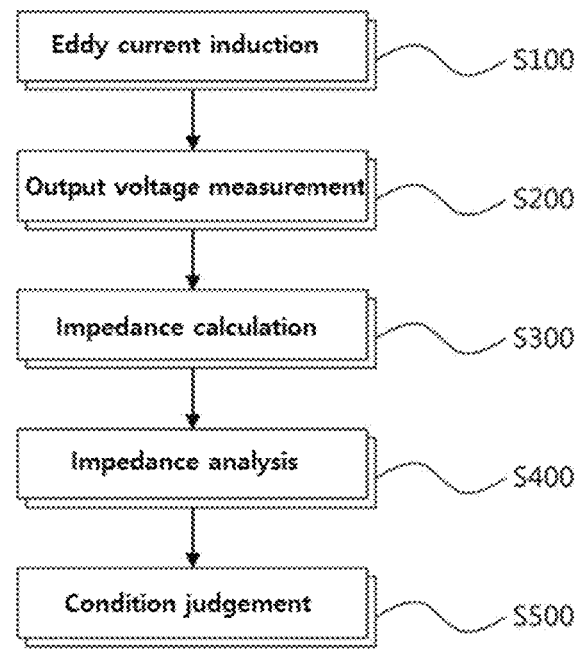

[Fig. 2]
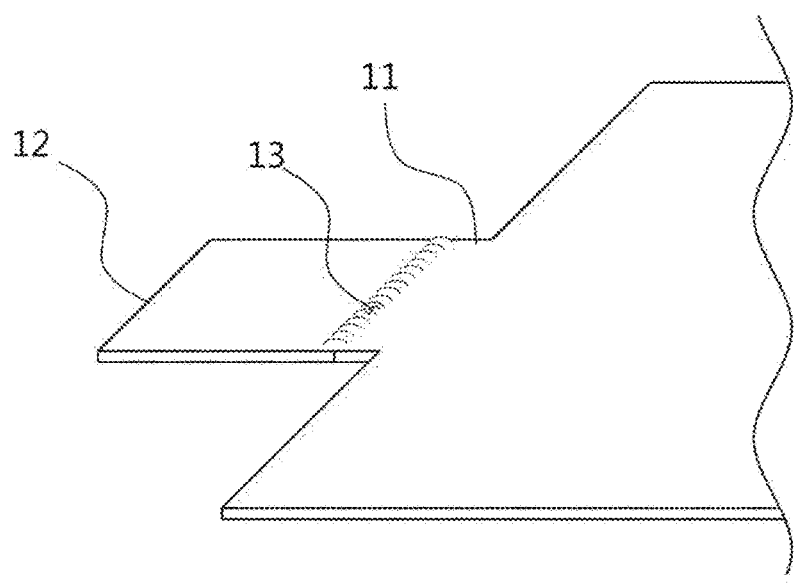

[Fig. 3]
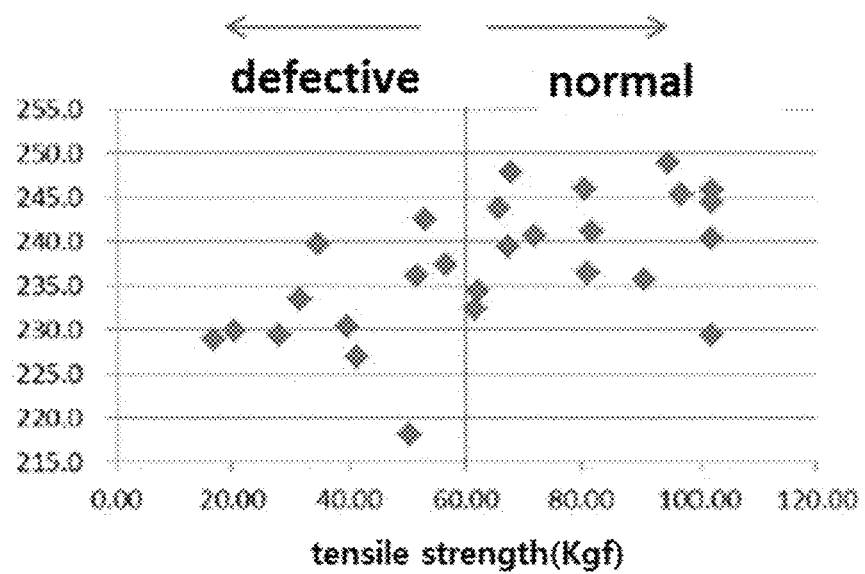

[Fig. 4]
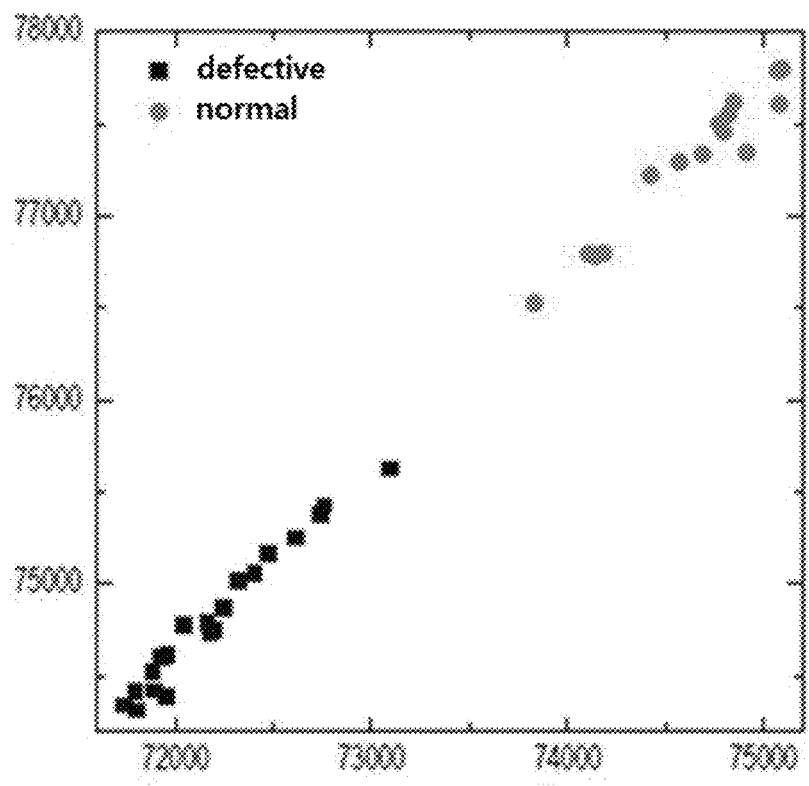

[Fig. 5]
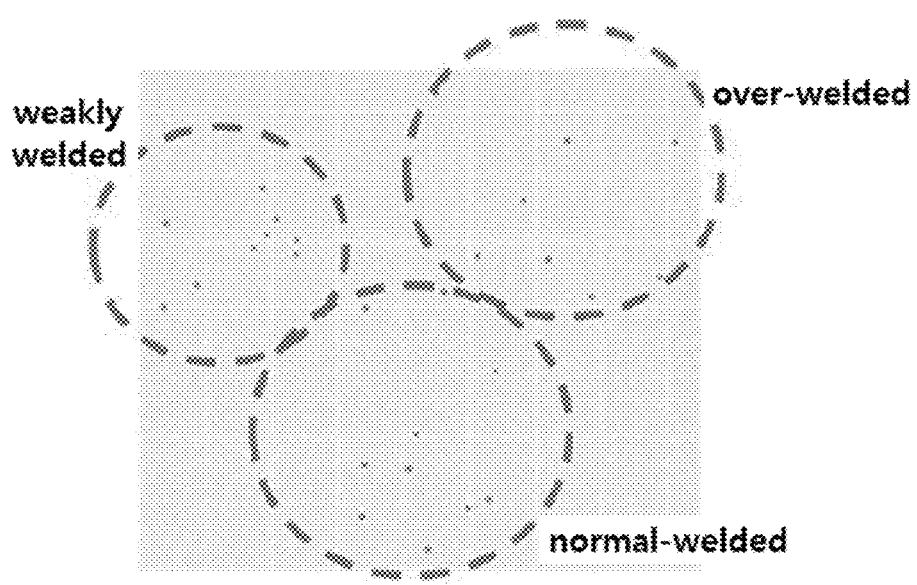

BIG DATA-BASED BATTERY INSPECTION METHOD

TECHNICAL FIELD

This application claims the benefit of priority from Korean Patent Application No. 10-2020-0022634, filed on Feb. 25, 2020, the entire disclosure of which is incorporated by reference herein.

The present invention relates to a method for inspecting a battery based on big data, and more specifically, a method for inspecting a battery based on big data for quickly inspecting a condition of a metal portion of the battery by applying information on the metal portion measured by an eddy current sensor to a discriminant function.

BACKGROUND ART

In general, a secondary battery is a battery that can be used repeatedly through a discharging process that converts chemical energy into electrical energy and a charging process in the reverse direction thereof, and the type of the secondary battery includes a nickel-cadmium (Ni—Cd) battery, a nickel-hydrogen (Ni-MH) battery, a Li-metal battery, a Li-ion battery, a Li-ion polymer battery, etc. Among these secondary batteries, lithium secondary batteries having high energy density and voltage, long cycle life, and low self-discharge rate have been commercialized and widely used.

The battery cell provided with an electrode assembly consisting of a positive electrode, a negative electrode and a separator built into a battery case can be provided. The battery may include an electrode terminal configured by welding electrode tabs protruding from a current collector onto an electrode lead.

At this time, if a process such as welding is not performed normally in the tab-lead connecting portion of the secondary battery, an electric current may flow abnormally or the electrical connection may become unstable due to shock or vibration applied to the battery, and in severe cases, the electrode lead and the electrode tab may be separated.

Accordingly, there is a need for a method capable of quickly and accurately inspecting physical and electrical problems in the battery tab-lead connecting portion.

DETAILED DESCRIPTION OF THE INVENTION

Technical Problem

The present invention relates to a method for inspecting battery based on big data, and more specifically, it is to provide a method for inspecting battery based on big data for quickly inspecting a condition of a metal portion of the battery by applying information on the metal portion measured by an eddy current sensor to a discriminant function.

The technical problems to be achieved by the present invention are not limited to the technical problems mentioned above, and other technical problems not mentioned will be clearly understood by those of ordinary skill in the art to which the present invention belongs from the following description.

Solution to Problem

The method for inspecting a battery based on big data may comprise an eddy current induction step of inputting an input current that is an AC current into a transmission coil and irradiating a primary magnetic field generated in the transmission coil to a metal portion of the battery to induce an eddy current in the metal portion of the battery; an output voltage measurement step of inputting a secondary magnetic field generated by the eddy current generated in the eddy current induction step into a receiving coil and measuring an induced electromotive force in the receiving coil generated by the secondary magnetic field; an impedance calculation step of calculating an impedance based on the input current value and the output voltage value; an impedance analysis step of separating a real part and an imaginary part from the impedance value, inputting them into a discriminant function and outputting a discrimination value from the discriminant function; and a condition judgement step of judging a condition of the metal portion of the battery based on the discrimination value output in the impedance analysis step.

Effect of the Invention

The method for inspecting a battery based on big data of the present invention is for inspecting the metal portion of the battery, and specifically, according to the present invention, it is possible to quickly and accurately analyze and judge a physical and electrical connection condition in the battery tab-lead connecting portion in which the electrode tab and the electrode lead are connected, by using the measurement value of an eddy current sensor that is a non-destructive testing device.

The method for inspecting a battery based on big data of the present invention enable to inspect the condition of the metal portion of the battery quickly and accurately and not to destroy the object to be inspected, so that it can be applied to the mass production line, allowing full inspection of the battery, unlike the sampling inspection system of inspecting some objects in the population.

BRIEF DESCRIPTION OF DRAWINGS

FIG. 1 is a block diagram showing a method for inspecting a battery based on big data.

FIG. 2 is a perspective view showing the metal portion of the battery to which the method for inspecting a battery based on big data of the present invention is applied.

FIG. 3 is a graph showing a correlation between an impedance value measured with a single-frequency input current and a condition of the metal portion of the battery.

FIG. 4 and FIG. 5 are graphs showing test results of the method for inspecting a battery based on big data of the present invention.

BEST MODE FOR CARRYING OUT THE INVENTION

The method for inspecting a battery based on big data may comprise an eddy current induction step of inputting an input current that is an AC current into a transmission coil and irradiating a primary magnetic field generated in the transmission coil to a metal portion of the battery to induce an eddy current in the metal portion of the battery; an output voltage measurement step of inputting a secondary magnetic field generated by the eddy current generated in the eddy current induction step into a receiving coil and measuring an induced electromotive force in the receiving coil generated by the secondary magnetic field; an impedance calculation step of calculating an impedance based on the input current value and the output voltage value; an impedance analysis step of separating a real part and an imaginary part from the impedance value, inputting them into a discriminant function and outputting a discrimination value from the discriminant function; and a condition judgement step of judging a condition of the metal portion of the battery based on the discrimination value output in the impedance analysis step.

In the eddy current induction step of the method for inspecting a battery based on big data of the present invention, the input current may comprise a plurality of partial AC currents having different set frequencies.

In the method for inspecting a battery based on big data of the present invention, the input current may be calculated by Equation 1 below:

$$I = \sum_{n=1}^{N} I_{Pn} e^{2\pi f_n t i} \quad \text{[Equation 1]}$$

I is an input current, N is the number of partial AC current values, $I_{Pn}$ is a complex number representing the amplitude and phase of the $n^{th}$ partial AC current, $f_n$ is a set frequency of the $n^{th}$ partial AC current, and t is a time.

In the eddy current induction step of the method for inspecting a battery based on big data of the present invention, the transmission coil may irradiate the primary magnetic field to the surface of the metal portion of the battery while a longitudinal direction of the transmission coil is perpendicular to the surface of the metal portion of the battery.

In the output voltage measurement step of the method for inspecting a battery based on big data of the present invention, the receiving coil may be disposed such that a longitudinal direction of the receiving coil is perpendicular to the surface of the metal portion of the battery.

In the impedance calculation step of the method for inspecting a battery based on big data of the present invention, the impedance may be calculated by dividing the output voltage value by the input current value.

In the method for inspecting a battery based on big data of the present invention, the impedance may comprise a plurality of partial impedances corresponding to each of the set frequencies.

In the impedance analysis step of the method for inspecting a battery based on big data of the present invention, a plurality of the discriminant function may be provided, and each of the discrimination values for the plurality of discriminant functions may be calculated by Equation 4 below:

$$D_m = \sum_{n=1}^{N} (Cr_{m,n} R_n + Cx_{m,n} X_n) \quad \text{[Equation 4]}$$

$D_m$ is a discrimination value of the $m^{th}$ discriminant function, N is the number of the set frequencies, $R_n$ is a real part of the partial impedance corresponding to the $n^{th}$ set frequency, $X_n$ is an imaginary part of the partial impedance corresponding to the $n^{th}$ set frequency, and $Cr_{m,n}$ and $Cx_{m,n}$ are discrimination coefficients corresponding to the $n^{th}$ set frequency of the $m^{th}$ discriminant function.

In the method for inspecting a battery based on big data of the present invention, the discrimination coefficients may be calculated based on sample impedance values measured in metal portions of a plurality of the sample batteries and condition information values of the metal portions of the plurality of the sample batteries.

In the method for inspecting a battery based on big data of the present invention, the condition information value may comprise at least one information of an ohmic resistance value, a welding thickness, and a tensile strength of the metal portion of the sample battery.

In the impedance analysis step of the method for inspecting a battery based on big data of the present invention, m discrimination values may be calculated for each of the metal portion of the battery, and in the condition judgement step, the condition of the metal portion of the battery may be judged by concurrently considering at least two discrimination values among the m discrimination values.

In the method for inspecting a battery based on big data of the present invention, the condition judgement step may comprise a discrimination value selection step of selecting two discrimination values among the m discrimination values, a graph output step of outputting a two-dimensional discrimination graph in which the discrimination values selected in the discrimination value selection step are used as each axis, and a data marking step of displaying the discrimination value of the metal portion of the battery as a coordinate on the discrimination graph output in the graph output step.

In the graph output step of the method for inspecting a battery based on big data of the present invention, a plurality of the condition areas indicating the condition of the metal portion of the battery may be displayed on the discrimination graph.

MODE FOR CARRYING OUT THE INVENTION

Hereinafter, embodiments according to the present invention will be described in detail with reference to the accompanying drawings. In this process, the size or shape of the components illustrated in the drawings may be exaggerated for clarity and convenience of description. In addition, terms specifically defined in consideration of the configuration and operation of the present invention may vary according to the intention or custom of users or operators. Definitions of these terms should be made based on the contents throughout this specification.

FIG. 1 is a block diagram showing a method for inspecting a battery based on big data. FIG. 2 is a perspective view showing the metal portion of the battery to which the method for inspecting a battery based on big data of the present invention is applied. FIG. 3 is a graph showing a correlation between an impedance value measured with a single-frequency input current and a condition of the metal portion of the battery. FIG. 4 and FIG. 5 are graphs showing test results of the method for inspecting a battery based on big data of the present invention.

Hereinafter, the method for inspecting a battery based on big data of the present invention will be described in detail with reference to FIGS. 1 to 5.

As shown in FIG. 1, the method for inspecting a battery based on big data of the present invention may comprise an eddy current induction step (S100) of inputting an input current that is an AC current into a transmission coil and irradiating a primary magnetic field generated in the transmission coil to a metal portion of the battery to induce an eddy current in the metal portion of the battery; an output voltage measurement step (S200) of inputting a secondary magnetic field generated by the eddy current generated in the eddy current induction step (S100) into a receiving coil and measuring an induced electromotive force in the receiving coil generated by the secondary magnetic field; an impedance calculation step (S300) of calculating an impedance based on the input current value and the output voltage value; an impedance analysis step (S400) of separating a real part and an imaginary part from the impedance value, inputting them into a discriminant function and outputting a discrimination value from the discriminant function; and a condition judgement step (S500) of judging a condition of the metal portion of the battery based on the discrimination value output in the impedance analysis step (S400).

In the method for inspecting a battery based on big data of the present invention, the metal portion of the battery included in the battery may be measured by an eddy current sensor that is a non-destructive testing device, and the impedance value measured by the eddy current sensor may be input into a discriminant function, thereby inspecting the condition of the metal portion of the battery quickly and accurately.

In the method for inspecting a battery based on big data of the present invention, the metal portion of the battery to be inspected may be the electrode current collector, the electrode tab 11 and the electrode lead 12, which are included in the battery, or may be a connection region in which the electrode current collector, the electrode tab 11 and the electrode lead 12 are connected to each other. Specifically, as shown in FIG. 2, the metal portion of the battery may be a tab-lead connection region 13 in which the electrode tab 11 protruding from the electrode current collector and the electrode lead 12 that bite an electrical terminal of an external device are connected to each other by welding or the like.

The eddy current sensor used in the method for inspecting a battery based on big data of the present invention may comprises a transmission coil for irradiating a primary magnetic field, which is an alternating magnetic field, to a metal portion of the battery to be inspected, and a receiving coil for receiving a secondary magnetic field radiated by an eddy current generated by the primary magnetic field in the metal portion of the battery to generate an electromotive force. The transmission coil and the receiving coil may be disposed in a non-contact condition by being spaced apart from the metal portion of the battery with a predetermined distance. The transmission coil and the receiving coil are provided in a cylindrical shape, a square pillar, a polygonal pillar, and the like, and may be a wire wound so that a magnetic field is generated in the longitudinal direction of the transmission coil and the receiving coil.

In the eddy current induction step (S100), the input current may include a plurality of partial AC currents having different set frequencies. FIG. 3 is a graph showing a correlation between an impedance value measured with a single-frequency input current and a condition of the metal portion of the battery, wherein the x-axis is a tensile strength and the y-axis is an impedance at 8500 Hz. As shown in FIG. 3, the impedance measured at a single frequency has lack of direct correlation with the condition of the metal portion of the battery, and therefore, it is difficult to distinguish between a defective condition and a normal condition only with a single frequency.

In the method for inspecting a battery based on big data of the present invention, in the eddy current induction step (S100), by forming an eddy current in the metal portion of the battery through an input current including a plurality of partial AC currents having different set frequencies, the same number of impedance values as the number of partial AC currents can be obtained as a measurement value and the condition of the metal portion of the battery can be judged accurately.

The set frequency of each of the plurality of partial AC currents may be selected in the 100 Hz to 200 Hz band. If the set frequency is more than 200 kHz, excessively strong eddy current is formed only on the surface of the metal portion of the battery to be inspected, so that an insignificant impedance value is measured. If the set frequency is less than 100 Hz, the primary magnetic field penetrates deep into the metal portion of the battery, but the density of the eddy current induced at that depth is low, so noise can be measured in the receiving coil. Therefore, it may be desirable that the set frequency is selected within the 100 Hz to 200 Hz band.

The number of partial AC currents, i.e., the number of set frequencies, may be preferably 2 to 16. If the number of set frequencies is too small, the accuracy of the inspection decreases. In contrast, if the number of set frequencies is too large, not only it takes time to calculate the result, but also it may take a lot of cost and time for mining of the discriminant function, and the measurement results may be overlapped between frequencies. Accordingly, the number of set frequencies may preferably be 2 to 16, and more preferably the number of set frequencies may be 8. For example, the number of set frequencies may be 8, and each set frequency may be selected from 6000 Hz, 6800 Hz, 7200 Hz, 7500 Hz, 8000 Hz, 8500 Hz, 9200 Hz and 9700 Hz.

In the eddy current induction step (S100), although each of the partial AC currents can be sequentially input to the transmission coil as an input current, a value obtained by summing all partial AC currents can be input to the transmission coil as an input current. When the input current is input to the transmission coil, the excitation current may remain in the transmission coil, the receiving coil, the metal portion of the battery, etc. even if the input current is cut off. For an accurate inspection, it may be desirable to re-input the input current into the transmission coil after the excitation current has been resolved. Therefore, when the partial AC currents are sequentially input to the transmission coil, the more the number of partial AC currents, that is, the number of set frequencies, the longer it takes for inspection. However, in the eddy current induction step (S100) of the method for inspecting a battery based on big data of the present invention, by inputting a value obtained by summing all partial AC currents to the transmission coil as an input current, the time required in the eddy current induction step (S100) and the output voltage measurement step (S200) can be reduced. That is, it may be desirable that a value obtained by summing all partial AC currents is input to the transmission coil as an input current.

Specifically, when a value obtained by summing partial AC currents is input to the transmission coil as an input current, the input current may be calculated by Equation 1 below:

$$I = \sum_{n=1}^{N} I_{Pn} e^{2\pi f_n ti} \qquad \text{[Equation 1]}$$

I is an input current, N is the number of partial AC current values, $I_{Pn}$ is a complex number representing the amplitude and phase of the $n^{th}$ partial AC current, $f_n$ is a set frequency of the $n^{th}$ partial AC current, and t is a time. Since N is the number of partial AC current values, it is also the number of set frequencies or the number of partial impedance values to be described later.

In the eddy current induction step (S100), the transmission coil may irradiate a primary magnetic field to the surface of the metal portion of the battery while a longitudinal direction of the transmission coil is perpendicular to the surface of the metal portion of the battery. Specifically, the transmission coil may irradiate a primary magnetic field in a direction perpendicular to the surface of the metal portion of the battery.

In the output voltage measurement step (S200), the receiving coil may be arranged such that the longitudinal direction of the receiving coil is perpendicular to the surface of the metal portion of the battery. Specifically, the transmission coil may generate an electromotive force by absorbing a secondary magnetic field radiated in a direction perpendicular to the surface of the metal portion of the battery. The generated electromotive force can be measured as an output voltage value.

In the impedance calculation step (S300), the impedance may be calculated by dividing the output voltage value by the input current value. That is, the impedance may be calculated by Equation 2 below.

$$Z = \frac{V}{I} \quad \text{[Equation 2]}$$

Z is an impedance and V is an output voltage. Here, the output voltage V may be output as an alternating voltage.

In the impedance calculation step (S300), the impedance may comprise a plurality of partial impedances corresponding to each of the set frequencies. That is, the partial impedance may be provided as many as the number of set frequencies. Specifically, the impedance may be the sum of all partial impedances.

That is, the correlation between impedance and partial impedance may be expressed by Equation 3.

$$Z = \sum_{n=1}^{N}(R_n + X_n i) \quad \text{[Equation 3]}$$

$R_n$ is a real part of the partial impedance corresponding to the $n^{th}$ set frequency, and $X_n$ is an imaginary part of the partial impedance corresponding to the $n^{th}$ set frequency. $R_n$ and $X_n$ are real numbers.

In the impedance analysis step (S400), a plurality of the discriminant functions may be provided, and each of the discrimination values for the plurality of discriminant functions may be calculated by Equation 4 below:

$$D_m = \sum_{n=1}^{N}(Cr_{m,n}R_n + Cx_{m,n}X_n) \quad \text{[Equation 4]}$$

$D_m$ is a discrimination value of the $m^{th}$ discriminant function, N is the number of the set frequencies, $R_n$ is a real part of the partial impedance corresponding to the $n^{th}$ set frequency, $X_n$ is an imaginary part of the partial impedance corresponding to the $n^{th}$ set frequency, and $Cr_{m,n}$ and $Cx_{m,n}$ are discrimination coefficients corresponding to the $n^{th}$ set frequency of the $m^{th}$ discriminant function. The discrimination coefficient is a real number. In the method for inspecting a battery based on big data of the present invention, at least two discriminant functions are provided, and the condition of the metal portion of the battery may be judged according to a correlation between discrimination values, which are output values of the discriminant functions. The discriminant function may be provided as a linear function as in Equation 4.

The discrimination coefficients may be calculated based on sample impedance values measured in metal portions of a plurality of the sample batteries and condition information values of the metal portions of the plurality of the sample batteries. The metal portion of the sample battery may be a metal portion of the sample battery provided separately from the battery to be inspected.

The sample impedance value may be an impedance value obtained by performing the eddy current induction step (S100), the output voltage measurement step (S200), and the impedance calculation step (S300) on the metal portion of the sample battery.

The condition information value of the metal portion of the sample battery may include at least one information of an ohmic resistance value, a welding thickness, and a tensile strength of the metal portion of the sample battery. The condition information value of the metal portion of the sample battery may be a physical quantity directly measured by a measuring device such as a resistance sensor or a tensile strength meter with respect to the metal portion of the sample battery.

The discriminant function may be data mined based on the sample impedance values and the condition information values, and the values of discrimination coefficients may be tuned according to the results of data mining.

The discriminant function may be data mined with the sample impedance values and condition information values extracted from sample batteries of at least 6 times the number N of set frequencies. Specifically, the discriminant function may be data mined by applying a coefficient derived from a statistical program (R, Mini tap, etc.). In the actual mass production of the battery, the Lot number is generally 10,000 or more, and therefore, it may be ideal to extract impedance information from 10,000 or more sample batteries. However, when the discriminant function is data mined with the sample impedance values and condition information values extracted from sample batteries of at least 6 times the number N of set frequencies, a discriminant function with a certain level of reliability can be achieved.

In the impedance analysis step (S400), for each metal portion, m discrimination values are calculated, and in the condition judgement step (S500), the condition of the metal portion of the battery is judged by concurrently considering at least two discrimination values among the m discrimination values. Specifically, the condition of the metal portion of the battery may be judged by selecting some discrimination values among a plurality of discrimination values according to a condition to be judged, such as a welding condition, a conducting state and the like, and analyzing a correlation between the discrimination values.

Specifically, the condition judgement step (S500) may comprise a discrimination value selection step of selecting two discrimination values among the m discrimination values, a graph output step of outputting a two-dimensional discrimination graph in which the discrimination values selected in the discrimination value selection step are used as each axis, a data marking step of displaying the discrimination value of the metal portion of the battery as a coordinate on the discrimination graph output in the graph output step.

In the graph output step, a plurality of the condition areas indicating the condition of the metal portion of the battery may be displayed on the discrimination graph. Accordingly, the condition of the metal portion of the battery may be judged according to which area on the discrimination graph the coordinate for the condition of the metal portion of the battery is displayed. The condition area may be judged according to the correlation between the discrimination values.

Example 1

The inspection was performed on the metal portions of 25 normal batteries and the metal portions of 25 defective batteries by applying the method for inspecting a battery based on big data of the present invention.

An eddy current induction step (S100) and an output voltage measurement step (S200) were performed on a tab-lead connection region 13 in which an electrode tab 11 made of an aluminum thin film and an electrode lead 12 made of an aluminum alloy were ultrasonically welded. At this time, the sum of 8 partial AC currents, of which set frequencies are 6000 Hz, 6800 Hz, 7200 Hz, 7500 Hz, 8000 Hz, 8500 Hz, 9200 Hz and 9700 Hz, respectively, was used as an input current value in the eddy current testing instrument.

The discriminant function was data mined with the sample impedance values and condition information values extracted from the metal portions of the 50 sample batteries, and the impedance analysis step (S400) was performed with the discriminant function derived from a statistical program and the condition judgement step (S500) was performed with 16 discrimination values.

The graph of FIG. 4 is a two-dimensional discrimination graph in which two discrimination values are used as each axis, wherein the coordinate indicated by a circle is the metal portion of the normal battery and the coordinate indicated by a square is the metal portion of the defective battery. As shown in FIG. 4, it can be seen that the coordinate of the metal portion of the normal battery and the coordinate of the metal portion of the defective battery are separated from each other and are concentrated.

Example 2

The inspection was performed on the metal portions of a total of 30 batteries, i.e., 10 weakly welded batteries, 10 over-welded batteries, and 10 normal-welded batteries, by applying the method for inspecting a battery based on big data of the present invention.

An eddy current induction step (S100) and an output voltage measurement step (S200) were performed on a tab-lead connection region 13 in which an electrode tab 11 made of an aluminum thin film and an electrode lead 12 made of an aluminum alloy were ultrasonically welded. At this time, the sum of 8 partial AC currents, of which set frequencies are 30 kHz, 50 kHz, 70 kHz, 90 kHz, 110 kHz, 130 kHz, 150 kHz and 170 kHz, respectively, was used as an input current value in the eddy current testing instrument.

The discriminant function was data mined with the sample impedance values and condition information values extracted from the metal portions of the 30 sample batteries, and the impedance analysis step (S400) was performed with the discriminant function derived from a statistical program R and the condition judgement step (S500) was performed with 32 discrimination values. Specifically, LD1 and LD2 were derived for a real part and an imaginary part of the impedance corresponding to each of the 8 partial input current values, respectively.

The graph of FIG. 5 is a two-dimensional discrimination graph in which two discrimination values are used as each axis. A plurality of condition areas representing a welding condition are displayed on the two-dimensional discrimination graph, and the coordinates for the condition of the metal portion of the battery are overlapped and marked in the condition area. As shown in FIG. 5, for the metal portions of a total of 30 batteries, it was judged that 10 batteries were weakly welded, 10 batteries were over-welded and 10 batteries were normal-welded. That is, the method for inspecting a battery based on big data of the present invention yielded accurate inspection results for all 30 batteries.

Although the embodiments according to the present invention have been described above, these are merely exemplary, and those of ordinary skill in the art will understand that various modifications and equivalent ranges of embodiments are possible therefrom. Therefore, the true technical protection scope of the present invention should be determined by the following claims.

INDUSTRIAL AVAILABILITY

The method for inspecting a battery based on big data of the present invention is for inspecting the metal portion of the battery, and specifically, according to the present invention, it is possible to quickly and accurately analyze and judge a physical and electrical connection condition in the battery tab-lead connecting portion in which the electrode tab and the electrode lead are connected, by using the measurement value of an eddy current sensor that is a non-destructive testing device.

The method for inspecting a battery based on big data of the present invention enable to inspect the condition of the metal portion of the battery quickly and accurately and not to destroy the object to be inspected, so that it can be applied to the mass production line, allowing full inspection of the battery, unlike the sampling inspection system of inspecting some objects in the population.

The invention claimed is:
1. A method for inspecting a battery based on big data comprising:
an eddy current induction step of inputting an input current that is an AC current into a transmission coil and irradiating a primary magnetic field generated in the transmission coil to a metal portion of the battery to induce an eddy current in the metal portion of the battery;
an output voltage measurement step of inputting a secondary magnetic field generated by the eddy current generated in the eddy current induction step into a receiving coil and measuring an induced electromotive force in the receiving coil generated by the secondary magnetic field;
an impedance calculation step of calculating an impedance based on the input current value and the output voltage value;
an impedance analysis step of separating a real part and an imaginary part from the impedance value, inputting them into a discriminant function and outputting a discrimination value from the discriminant function; and
a condition judgement step of judging a condition of the metal portion of the battery based on the discrimination value output in the impedance analysis step,
wherein
in the eddy current induction step, the input current comprises a plurality of partial AC currents having different set frequencies, in the impedance calculation step, the impedance is calculated by dividing the output voltage value by the input current value, and the impedance comprises a plurality of partial impedances corresponding to each of the set frequencies, in the impedance analysis step, a plurality of the discriminant functions are provided, and each of the discrimination values for the plurality of discriminant functions is calculated by Equation 4 below:

$$D_m = \sum_{n=1}^{N} (Cr_{m,n} R_n + Cx_{m,n} X_n) \quad \text{[Equation 4]}$$

$D_m$ is a discrimination value of the $m^{th}$ discriminant function, N is the number of the set frequencies, $R_n$ is a real part of the partial impedance corresponding to the $n^{th}$ set frequency, $X_n$ is an imaginary part of the partial impedance corresponding to the $n^{th}$ set frequency, and $Cr_{m,n}$ and $Cx_{m,n}$ are discrimination coefficients corresponding to the $n^{th}$ set frequency of the $m^{th}$ discriminant function.

2. The method for inspecting a battery based on big data according to claim 1, wherein the input current is calculated by Equation 1 below:

$$I = \sum_{n=1}^{N} I_{Pn} e^{2\pi f_n t i} \quad \text{[Equation 1]}$$

I is an input current, N is the number of partial AC current values, $I_{Pn}$ is a complex number representing the amplitude and phase of the $n^{th}$ partial AC current, $f_n$ is a set frequency of the $n^{th}$ partial AC current, and t is a time.

3. The method for inspecting a battery based on big data according to claim 1, wherein in the eddy current induction step, the transmission coil irradiates the primary magnetic field to the surface of the metal portion of the battery while a longitudinal direction of the transmission coil is perpendicular to the surface of the metal portion of the battery.

4. The method for inspecting a battery based on big data according to claim 1, wherein in the output voltage measurement step, the receiving coil is disposed such that a longitudinal direction of the receiving coil is perpendicular to the surface of the metal portion of the battery.

5. The method for inspecting a battery based on big data according to claim 1, wherein the discrimination coefficients are calculated based on sample impedance values measured in metal portions of a plurality of the sample batteries and condition information values of the metal portions of the plurality of the sample batteries.

6. The method for inspecting a battery based on big data according to claim 5, wherein the condition information value comprises at least one information of an ohmic resistance value, a welding thickness, and a tensile strength of the metal portion of the sample battery.

7. The method for inspecting a battery based on big data according to claim 1, wherein in the impedance analysis step, m discrimination values are calculated for each of the metal portion of the battery, and in the condition judgement step, the condition of the metal portion of the battery is judged by concurrently considering at least two discrimination values among the m discrimination values.

8. The method for inspecting a battery based on big data according to claim 7, wherein the condition judgement step comprises:

a discrimination value selection step of selecting two discrimination values among the m discrimination values, a graph output step of outputting a two-dimensional discrimination graph in which the discrimination values selected in the discrimination value selection step are used as each axis, and a data marking step of displaying the discrimination value of the metal portion of the battery as a coordinate on the discrimination graph output in the graph output step.

9. The method for inspecting a battery based on big data according to claim 8, wherein in the graph output step, a plurality of the condition areas indicating the condition of the metal portion of the battery are displayed on the discrimination graph.

* * * * *